United States Patent [19]

Parkinson

[11] Patent Number: 5,021,672

[45] Date of Patent: Jun. 4, 1991

[54] ETCHING OF NANOSCALE STRUCTURES

[75] Inventor: Bruce A. Parkinson, Hockessin, Del.

[73] Assignee: E. I. Du Pont de Nemours and Company, Wilmington, Del.

[21] Appl. No.: 455,222

[22] Filed: Dec. 22, 1989

[51] Int. Cl.$^5$ ............................................. H01J 37/30
[52] U.S. Cl. .............................. 250/492.2; 250/423 F
[58] Field of Search ................. 250/306, 423 F, 442.1, 250/492.2

[56] References Cited

U.S. PATENT DOCUMENTS

| | | | |
|---|---|---|---|
| 4,343,993 | 8/1982 | Binnig et al. | 250/306 |
| 4,550,257 | 10/1985 | Binnig et al. | 250/492.2 |
| 4,785,185 | 11/1988 | Wells | 250/492.2 |
| 4,829,507 | 5/1989 | Kazan et al. | 369/126 |
| 4,894,537 | 1/1990 | Blackford et al. | 250/442.1 |
| 4,896,044 | 1/1990 | Li et al. | 250/492.2 |

FOREIGN PATENT DOCUMENTS 63-60196  3/1988  Japan.
63-271743  11/1988  Japan.

OTHER PUBLICATIONS

Wickramasinghe, H. K., Scientific American, Oct. (1989), pp. 98–105.
Rabe, J. P., Angew. Chem. Int. Ed. Engl. 28 (1989), No. 1, pp. 117–122.
Hansma et al., Science, 242, Oct. 14, 1988, pp. 209–216.
McCord et al., J. Vac. Sci. Technol. B 4(1), 86–88 (1986).
McCord et al., J. Vac. Sci. Technol. B 6 (1), 293–296 (1988).
Research Disclosure 28130, Sep. 1987.
Schneir et al., J. Appl. Phys. 63, 717–721 (1988).
Schneir et al., Langmuir, 3, 1025–1027 (1987).
McCord et al., J. Vac. Sci. Technol. B 6 1877–1880 (1988).
Emch et al., J. Appl. Phys., 65, 79–84 (1989).
Staufer et al., J. Vac. Sci. Technol. A6, 537–539 (1988).
Ringger et al., Appl. Phys. Lett. 46, 832–834 (1985).
Van Loenen et al., Appl. Phys. Lett. 55, (13), 1312–1413, Sep. 25, 1989.
Jaklevic et al., Physical Review Letters, 60, 120–123 (1988).
Garfunkel et al., Science, 246, 99–100, Oct. 6, 1989.
Becker et al., Nature, 325, 419–421 (1987).

*Primary Examiner*—Bruce C. Anderson

[57] ABSTRACT

A process for etching with a scanning tunneling microscope using a two-dimensional metal chalcogenide as the substrate, is disclosed.

12 Claims, 1 Drawing Sheet

ETCHING OF NANOSCALE STRUCTURES

FIELD OF THE INVENTION

The present invention relates to a process for the etching of one or more molecular layers from a substrate on a nanometer scale with a scanning tunneling microscope by ablation of atoms rastered by the microscope tip.

BACKGROUND OF THE INVENTION

The scanning tunneling microscope, hereinafter STM, is an instrument capable of resolving surface detail down to the atomic level. The microscope's conductive tip, ideally terminating in a single atom, traces the contours of a surface with atomic resolution. The tip is maneuvered to within a nanometer or so of the surface of a conducting substrate so that the electron clouds of the atom at the probe tip overlap that of the nearest atom of the sample. When a small voltage is applied, electrons tunnel across the gap between the microscope tip and the substrate, generating a tunneling current the magnitude of which is sensitive to the size of the gap. Typically the tunneling current decreases by a factor of 10 each time the gap is widened by 0.1 nanometer.

Movement of the microscope tip is controlled by piezoelectric controls. In one mode of operation, the tip or probe is held at a constant height as it is moved horizontally back and forth across the sample surface in a raster pattern, its parallel tracks separated by a fraction of a nanometer. This causes the tunneling current to fluctuate and the current variation is measured and translated into an image of the surface. The current increases when the tip is closer to the surface, as when passing over bumps such as a surface atom, and decreases when the tip is farther from the surface, as when passing over gaps between atoms. In an alternative mode of operation, the probe or tip moves up and down in concert with the surface topography as it is moved across the surface in a raster pattern. Its height is controlled to maintain a constant tunneling current between the tip and the surface. The variations in voltage required to maintain this constant gap are electronically translated into an image of surface relief.

The image obtained by either mode of operation is not a topographical map of the surface, but a surface of constant tunneling probability affected by the variations in the occurence and energy levels of the electrons present in the surface atoms. If the surface is composed of a single type of atom, the image may closely resemble topography, but when various atoms are present pits or bumps will appear in the image depending upon their electronic structures.

Further detail on the structure and operation of the STM is disclosed in U.S. Pat. No. 4,343,993 of Binnig et al. issued Aug. 10, 1982; Wickramasinghe, H.K., Scientific American, October (1989) pp. 98-105; Rabe, J.P., Angew. Chem. Int. Ed. Engl. 28 (1989) No. 1, pp. 117-122; and Hansma et al., Science, 242, Oct. 14, 1988, pp. 209-216.

The STM is useful not only for the imaging or characterization of surfaces, but also for manipulating surfaces on a scale as small as subnanometers. Lithography using the STM is of current interest in the area of electronics for information storage and in the design of transistors, diodes, integrated circuits and the like. The miniaturization of electronic components is increasing the speed of computers. The ability to manipulate single atoms or molecules with the STM provides unique potential applications in microelectronics. Various approaches have been explored in the use of STM for etching or writing.

STM is limited to imaging or manipulating surfaces which conduct electrons. Therefore, thin conductive coatings or replicas have been used on substrate surfaces which are nonconducting. See McCord et al., J.Vac. Sci. Technol. B 4 (1), 86-88 (1986); McCord et al., J. Vac. Sci. Technol. B 6(1), 293-296 (1988); Research Disclosure 28130, Sept. 1987; Schneir et al., J. Appl. Phys., 63, 717-721 (1988); and Schneir et al., Langmuir, 3, 1025-1027 (1987).

Metal deposition onto a substrate surface from a gas is another method which has been used to pattern lines using the STM. See McCord et al., J. Vac. Sci. Technol. B 6, 1877-1880 (1988); Japan Patent Application 63-271,743 published Nov. 9,1988; and U.S. Pat. No. 4,550,257 of Binnig et al., issued Oct. 29, 1985. Metal deposition onto gold is taught by Emch et al., J. Appl. Phys., 65, 79-84 (1989). Deposition of particles onto the surface from a carrier is disclosed in U.S. Pat. No. 4,829,507 of Kazan et al. issued May 9, 1989.

The formation of protrusions or raised surface areas on metallic glasses by local heating using the STM has also been reported as a means of nanometer lithography by Staufer et al., J. Vac. Sci. Technol., A 6, 537-539 (1988) and Ringger et al., Appl. Phys. Lett. 46, 832-834 (1985).

Writing using the STM wherein the microscope tip physically touches, scratches, indents, or creates holes in the substrate surface has been taught by Van Loenen et al., Appl. Phys. Lett., 55, (13), 1312-1413, Sept. 25, 1989; Jaklevic et al., Physical Review Letters, 60, 120-123 (1988); and Garfunkel et al., Science, 246, 99-100, Oct. 6, 1989.

Another approach to writing with the STM has been to use the tunneling current for surface rearrangement of the atoms already present. Such lithography has not been reliably reproducible. See Becker et al., Nature, 325, 419-421 (1987), and Japan Patent Application 63-60,196 published Mar. 16, 1988.

In all of the known methods of lithography using STM, the image cannot be viewed simultaneously with its creation, but is viewed afterwards. A post writing treatment is often required to stabilize the image. The substrate or writing surface is destructively deformed using many of the known techniques. Further the known techniques are not sufficiently reliable or reproducible to use in manufacturing applications.

It is therefore an object of the present invention to provide a process for etching using STM wherein the etched image can be viewed simultaneously with its creation.

It is a further object of the present invention to provide a lithography process using STM which requires no post writing treatment to stabilize the image.

It is a further object of the present invention to provide a lithography process using STM which can controllably remove one molecular layer at a time.

It is a further object of the present invention to provide a process for etching using the STM which does not destructively deform the substrate.

It is a further object of the present invention to provide a process for etching or writing using the STM which is reliably reproducible.

It is a further object of the present invention to provide a process for etching or writing using the STM wherein the depth of the etched structures are known to a precision of (0.0001×n) nanometer, where n is the number of layers etched, and the bottom of the etched structures ar atomically flat.

SUMMARY OF THE INVENTION

The present invention comprises a process for etching a structure using a STM comprising scanning the microscope tip over a two dimensional substrate of at least one metal chalcogenide at a voltage of −10 to +10 volts and a current of up to 2 microamps to generate the controlled ablation of one or more molecular layers of the metal chalcogenide. The resulting removal of the atoms rastered by the microscope tip can be viewed simultaneously with the rastering, thereby providing selective control of the precise depth of ablation. A single molecular layer can be removed one or more atoms at a time.

DETAILED DESCRIPTION OF THE INVENTION

Figure 1:
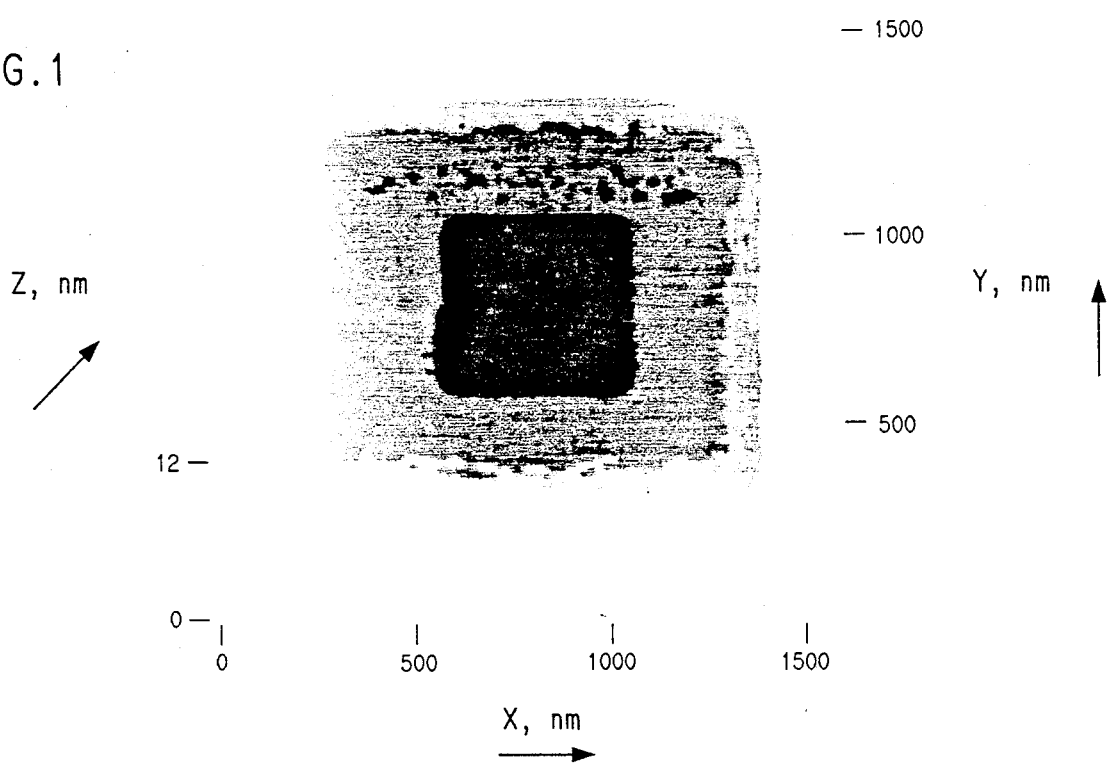
FIG. 1 is a line drawing of the etched material resulting from Example 1.

The term "etching" as used hereinafter shall mean the ablation of a single molecular layer from a substrate surface one or more atoms at a time.

The term "ablation" as used herein means the removal or disappearance of atoms leaving behind no residue of the individual atoms removed.

The term "STM", as previously defined, means scanning tunneling microscope.

The term "holes" as used herein means the space left upon ablation of atoms of one or more molecular layers of a substrate, but does not necessarily denote that the entire thickness of the substrate has been penetrated.

The term "nucleation" as used herein means the initiation of hole growth.

The term "structure" as used herein means the etched image, figures, letters or drawings created by the process of the present invention.

The term "two dimensional substrate" as used herein means a material wherein the bonding is strongest in two dimensions which results in easy cleavage to expose atomically flat surfaces.

The present invention comprises a process for the sequential etching of one or more molecular layers from a substrate on a nanometer scale with a STM by ablation of atoms rastered by the microscope tip. Since the ablation can be viewed while etching, very precise control or manipulation of the scope and depth of the etching can be achieved in a reliably reproducible manner. The substrate is not destructively deformed. Further, no post writing treatment is required to stabilize the image.

In the process of the present invention the substrate can be etched one molecular layer at a time by removal of one or more atoms at a time in a very controlled fashion by scanning the tunneling microscope over the surface, preferably in air, at typical values of tunneling current and voltage. Alternatively, more than one molecular layer can be ablated simultaneously. Structures at the nanometer scale can be generated, but the lower limit of resolution is yet to be determined. Shape is controlled with the raster pattern of the microscope and depth is accurately controlled by counting the number of molecular layers etched. By variation in the size and position of the raster pattern rather complex features can be produced.

During the etching process of the present invention, the ablation of atoms appears as the nucleation and growth of holes in one or more layers of the substrate as the microscope tip scans the substrate surface. The growth of holes can be made to continue until one entire molecular layer is removed whereupon the next layer begins to nucleate holes and the process repeats. Alternatively, more than one molecular layer can be nucleated and ablated simultaneously. The shape of the nucleated holes may depend upon the crystal structure of the substrate. For example, ablation of $NbSe_2$ results in the appearance of triangular shaped holes reflecting the trigonal prismatic coordination of the metal atom in the 2H polytype of $NbSe_2$.

In most cases the image of the substrate remains clear during the etching process, but it can become less clear during periods of rapid etching. This usually occurs when the nucleation rate exceeds the hole growth rate. Faster nucleation results in simultaneous ablation of more than one molecular layer in the rastered region. In general, sharp features and islands are etched more rapidly than smooth edges. However, the speed of etching is dependent upon the substrate used and the microscope tip. Analysis of the depth information in a constant current scan of an etched area usually reveals that the step heights observed are all multiples of the molecular layer thickness of the substrate being etched within experimental error. Therefore depth can be controlled by counting the step heights or molecular layers etched. For example, a typical depth of 0.5–0.8 nm per layer results when $SnSe_2$ is used as the substrate. Thus the depth of the etched structure can be known and controlled to a precision of (0.0001×n) nanometer where n is the number of layers etched. Because typically one molecular layer at a time is removed, the bottom surface of the etching is atomically flat, which is an advantage in some practical applications of this technology.

The etching process of the present invention requires specific types of substrate as well as use of particular instrumental operating parameters. Substrates suitable for use in the process of this invention comprise metal chalcogenides having two dimensional bonding. Examples of such substrates include $InSe$, $ZrS_2$, $TiSe_2$, $SnSe_2$, $SnS_2$, $NbSe_2$, $TaS_2$, $MoSe_2$, $WSe_2$, and solid solutions thereof. The rate of etching from fastest to slowest for the various substrates is generally in the order listed above. The tungsten and molybdenum selenides etch slowly and only at rather high biases of greater than about 1.5 volts. Preferred substrates include $InSe$, $ZrS_2$, $TiSe_2$, $SnSe_2$, $SnS_2$, and $NbSe_2$. Most preferred for use herein are $SnSe_2$ and $NbSe_2$.

Molecular beam epitaxy can be used to fabricate layered structures by means of atomic or molecular beams. It allows atomic layer-by-layer deposition in a two dimensional growth process, resulting in the formation of crystalline materials of multiple or alternating thin layers of composition, each only a few atomic layers in thickness. See Ploog, K., Angewandte Chemie, Int'l Ed. in English, 27, 5, 593–758, May (1988), herein incorporated by reference. The structuring of solid materials using this technique provides new layered substrates to which the process of the present invention can be applied, so long as the top one or more layers are comprised of an etchable substrate. Substrates suitable for use as the top layer, or portion thereof, in such a material include the two dimensional metal chalcogenides as listed above. Such etchable substrates can be layered in any combination, or in combination with other substrates such as silicon or gallium arsenide. The process of the present invention can then be used to etch structures into these layered materials one or more molecular layers at a time to expose one or more of the underlying layers as desired. For example, exposure of silicon or gallium arsenide layers in particular patterns would be useful in the preparation of masks for small device fabrication.

Crystal perfection and purity are important factors in controlling the rate of nucleation and growth of holes during the etching process. Nucleation can occur at defects or dopant sites on the crystals. Highly doped crystals in some cases can result in the nucleation rate exceeding the hole expansion rate. When this occurs deep irregular features can result, but still showing clearly the multiple layers. The growth rate of holes appears to be the limiting factor with regard to size of the resulting etched figure or structure. An increase in the rate of etching can often be achieved by intentionally causing defects.

The rate of etching is affected not only by the substrate but also by the microscope tip or probe. Microscopic tip morphology is important. However the tip composition does not appear to influence the etching, as nearly identical results have been obtained in experiments using either platinum or tungsten tips. Etching occurs at either negative or positive tip biases.

Instrument operating parameters suitable for use in the process of the present invention include a tunneling current of up to about 2 microamps, and a voltage of from about −10 to about +10 volts, excluding 0 volts. The preferred tunneling current is from about 0.05 to about 5.0 nanoamps. The preferred voltage range is from about 0.05 volts to about 2.0 volts.

An inert atmosphere can be employed but is not required in the process of the present invention. The etching can be conducted in an air atmosphere. A reduced pressure atmosphere is not needed in the present invention.

One of the primary advantages of the process of the present invention is the ability to view the image simultaneously with its creation. Because the altered substrate can be viewed with certainty of its identity, the altered substrate can be used as a basis for attempting specific results dependent upon chemical bonding or atomic shape. Examples of potential uses include use of an etched substrate as a detector for specific molecules, as a site for stabilizing molecular forms, or as a site for specific reactions. Microelectronics and quantum well structures are areas of application. Other potential uses of the process of the present invention include data storage, preparation of masks for small device fabrication, etching of semiconductor and other substrates, or fabrication of transistor structures on the surface of materials.

The following examples illustrate the present invention but are not intended to limit it in any manner.

EXAMPLE 1

A structure was etched on a $SnSe_2$ substrate by scanning the platinum tip of a Nanoscope II STM available from Digital Instruments of Santa Barbara, Calif., over its surface in a raster pattern. The tunneling voltage employed was 480 mV and the tunneling current was 0.66nA. The structure created consists of a set of inscribed squares, with the largest one measuring 1 micrometer on each side and etched three molecular layers deep (1.8 nm), the intermediate square measuring 0.5 micrometer on each side and etched two molecular layers deep (1.2nm), and the smallest square measuring 0.20 micrometer on a side and etched one molecular layer deep (0.6nm). Analysis of a histogram of the heights in regions near the molecular steps demonstrated that the measured step heights were multiples of 0.6–0.8nm, corresponding to the c axis of the $SnSe_2$ unit cell. The average time to remove one molecular layer was about 20 minutes (moderate).

EXAMPLES 2–10

The substrates listed in Table I were etched using the process as in Example 1 at the conditions listed below.

TABLE I

| Example No. | Substrate | Tip | Bias, mV | Current, nA | Relative Speed |
| --- | --- | --- | --- | --- | --- |
| 2 | $SnSe_2$ | W | +480 | 1.31 | Rapid |
| 3 | $SnS_{0.2}Se_{1.8}$ | W | +385 | 0.40 | Rapid |
| 4 | $TaS_2$ | W | +2000 | 0.05 | Moderate |
| 5 | $SnS_2$ | Pt | ±550 | 1.2 | Moderate |
| 6 | $ZrS_2$ | Pt | ±550 | 1.2 | Very Rapid Neg. bias faster |
| 7 | $PtS_2$ | Pt | +550 | 1.2 | Moderate |
| 8 | $NbSe_2$ | Pt | ±950 | 1.2 | Rapid |
| 9 | $SnS_{0.7}Se_{1.3}$ | Pt/Ir | +550 | 1.2 | Very Rapid |
| 10 | InSe | Pt/Ir | +550 | 1.2 | Very Rapid |

What is claimed is:

1. A process for etching a structure using a scanning tunneling microscope comprising scanning the microscope tip over a two dimensional substrate of at least one metal chalcogenide at a voltage of from about −10 to about +10 volts and a current of up to about 2 microamps to generate a continuous controlled ablation of one or more molecular layers of the metal chalcogenide.

2. The process of claim 1 wherein a single molecular layer is ablated.

3. The process of claim 1 wherein more than one molecular layer is ablated simultaneously.

4. The process of claim 1 wherein the metal chalcogenide comprises InSe, $ZrS_2$, $TiSe_2$, $SnSe_2$, $SnS_2$, $NbSe_2$, TaS2, $MoSe_2$, or $WSe_2$ or solid solutions thereof.

5. The process of claim 4 wherein the metal chalcogenide comprises $SnSe_2$ or $NbSe_2$.

6. The process of claim 1 wherein the substrate comprises a layered material prepared by molecular beam epitaxy wherein at least one portion of the top layer is a two dimensional metal chalcogenide.

7. The process of claim 6 wherein the metal chalcogenide comprises InSe, $ZrS_2$, $TiSe_2$, $SnSe_2$, $SnS_2$, $NbSe_2$, $TaS_2$, $MoSe_2$, or $WSe_2$.

8. The process of claim 1 wherein the structure etched can be viewed simultaneously with its creation.

9. The process of claim 1 wherein the depth of the etched structure is controlled to a precision of $(0.0001 \times n)$ nanometer, wherein n is the number of layers etched.

10. The process of claim 1 wherein the substrate remains free of deformation or residue.

11. The process of claim 1 wherein the structure etched has a bottom surface that is atomically flat.

12. The etched structure comprising a two dimensional metal chalcogenide substrate from which surface atoms have been removed with a scanning tunneling microscope using the process of claim 1.

* * * * *